United States Patent [19]
Hsieh et al.

[11] Patent Number: 5,641,595
[45] Date of Patent: Jun. 24, 1997

[54] MANUFACTURE OF COLOR FILTERS BY INCREMENTAL EXPOSURE METHOD

[75] Inventors: Pao-Ju Hsieh, Keelung; Hsien-Kuang Lin, Taipei; Jim-Chyuan Shieh; Chao-Wen Niu, both of Hsinchu; Chao-Huei Tseng, Taipei; Hwa-Chi Cheng, Hsinchu, all of Taiwan

[73] Assignee: Industrial Technology Research Institute, Hsinchu, Taiwan

[21] Appl. No.: 591,201

[22] Filed: Jan. 16, 1996

[51] Int. Cl.$^6$ .................................................. G03F 9/00
[52] U.S. Cl. .................................................. 430/7; 430/20
[58] Field of Search .................................. 430/7, 20, 293; 205/120, 135

[56] References Cited

U.S. PATENT DOCUMENTS

| | | | |
|---|---|---|---|
| 4,786,148 | 11/1988 | Sekimura et al. | 350/339 |
| 4,812,387 | 3/1989 | Suzuki et al. | 430/311 |
| 4,820,619 | 4/1989 | Sanada et al. | 430/197 |
| 4,837,098 | 6/1989 | Shimamura et al. | 430/7 |
| 5,085,973 | 2/1992 | Shimizu et al. | 430/271 |
| 5,214,541 | 5/1993 | Yamasita et al. | 359/891 |
| 5,214,542 | 5/1993 | Yamasita et al. | 359/891 |
| 5,385,795 | 1/1995 | Yuasa et al. | 430/7 |
| 5,399,449 | 3/1995 | Tanimoto et al. | 430/7 |

*Primary Examiner*—S. Rosasco
*Attorney, Agent, or Firm*—W. Wayne Liauh

[57] ABSTRACT

A method for making color filters containing a color matrix with at least three desired colored layers comprising the steps of: (a) forming a positive energy-accumulable photoresist layer on a transparent electrically conductive substrate; (b) pre-conditioning the energy-accumulable photoresist layer to form at least three regions of different initial levels of exposure energy, from a highest to a lowest; (c) using a developer solution to develop and remove the region of the photoresist layer with the highest level of initial exposure energy to thereby cause a corresponding area of the electrically conductive substrate underlying the photoresist to be uncovered; (d) electrodepositing a photo-curable resin of a desired color and a predetermined exposure energy required for curing onto the uncovered area of the substrate; (e) overall-exposing the photoresist layer to a light source so as to impart an incremental exposure energy to all regions of the photoresist layer; (f) using a developer solution to develop and remove the region of the photoresist layer which has accumulatively attained the full exposure energy in step (e) and uncover a corresponding area on the substrate; (g) electrodepositing a photo-curable resin of another desired color onto the uncovered area of the substrate formed in step (f); and (h) repeating steps (e) through (g) until all the desired colored layers are selectively developed on the substrate. The incremental exposure energy is provided in step (e) such that: (i) it enables a region with a next highest initial exposure energy to attain full exposure energy, and (ii) it equals to or exceeds the exposure energy required for curing the photo-curable resin to thereby, at the same time, cause the photo-curable resin to become hardened.

20 Claims, 1 Drawing Sheet

MANUFACTURE OF COLOR FILTERS BY INCREMENTAL EXPOSURE METHOD

FIELD OF THE INVENTION

The present invention relates to a method for making color filters. More specifically, the present invention relates to an improved method for making color filters utilizing a positive photoresist. The color filters so prepared can be advantageously used in a variety of light-receiving surfaces such as LCD devices, flat panel displays, color video cameras, or the like; and the present invention provides a cost-effective method, which allows an improved flexibility of process variables including process materials, as well as more relaxed tolerance of process precisions, for making these high quality color filters.

BACKGROUND OF THE INVENTION

With the rapid growth of the information industry and continuous breakthroughs in the display technologies, a trend is becoming increasingly recognizable in that flat panel displays (FPD), which take up a much smaller space, are gradually taking the place of the traditional cathode ray tubes (CRT). Among the various flat panel displays, liquid crystal displays (LCD) have assumed a leading position, because of their light weight, small thickness, low driving voltage required, and low energy consumption. Another reason for the wide popularity of LCDs can also be attributed, at least in part, to the rapid development of the technologies that LCDs have been associated with. More recently, with the successful development of thin film transistors (TFT), LCDs now have acquired the capability of becoming a full-color display ready for a much broader consumer market. This development further enhances the already immense potential of LCDs.

With both the multi-color and full-color LCDs, chroma control and brightness control are the two most essential elements. These elements are provided by a high-grey-level (black-and-white) LCD, color filter films, and backlight devices. Of these, color filters provide the most important role for color control.

A color filter comprises three main components: a black-hued (i.e., black-colored) matrix, a color filter layer, and an overcoat. Currently, at least five methods have been disclosed in the prior art for making color filter layers. These include:

(1) dyeing,
(2) etching,
(3) pigment dispersion,
(4) electrodeposition, and
(5) printing.

The dyeing method and the etching method primarily utilize an appropriate arrangement of dyes to prepare color filters. A wide variety of dyes have been taught in the prior art references many of which provide homogeneous chroma, high dyeability, and allow a wide selection of compatible resins for which desired color intensity and light transmissibility can be provided. U.S. Pat. No. 4,820,619, the content thereof is incorporated herein by reference, a photosensitive composition is disclosed for use in preparing a color filter which contains a copolymer of glycidyl (meth)acrylate or glycidyl (α-methyl)vinyl ether with a (meth)acrylic amide or ester having a quaternary ammonium salt structure, and an aromatic azide as a photosensitizer. U.S. Pat. No. 4,837,098, the content thereof is incorporated herein by reference, discloses a colored filter layer comprises three groups of filter picture elements having spectral characteristics respectively corresponding to red, green and blue. Each group of filter picture elements (R, G, B) are made of polyimide resin and dye contained therein.

Because of the relatively inadequate light and heat resistances of the dyeing materials, the methods of dyeing and etching discussed above have been largely replaced by the pigment dispersion method and/or the electrodeposition method, both of which utilize pigments that exhibit superior light and heat resistances. In these methods, pigment particles are uniformly dispersed in a resin matrix. Typically, the pigment particles are controlled to have a particle size less than 0.2 µm so as to ensure reliable coloring characteristics. U.S. Pat. No. 5,085,973, the content thereof is incorporated herein by reference, discloses a color filter prepared by providing red, green, and blue image elements, each imaging element comprising a photosensitive resin and a pigment, and a black matrix on a transparent glass substrate. The photosensitive resin is formulated such that it comprises a polyfunctional acrylate monomer, an organic polymer binder and a photopolymerization initiator comprising a 2-mercapto-5-substituted thiadiazole compound, a phenyl ketone compound, and 2,4,5-triphenylimidazolyl dimer composed of two lophine residues combined to each other through intermediation of a single covalent bond. U.S. Pat. No. 4,786,148, the content thereof is incorporated herein by reference, discloses a color filter comprises a substrate and colored resin films, including blue, green and red resin films containing blue, green, red colorant particles, respectively. The average particle volumes of the blue, green and red colorants are set that the blue particles are greater than the green particles, which are further greater than the red particles. The pigment method is also disclosed in, for example, Japan Laid-Open Patent Publication JP60-129739. With the pigment dispersion method, lithographic techniques can be utilized to improve resolution, increase the flexibility of pattern design, and form color filters that can be used in TFT-LCDs. However, the conventional pigment-related methods typically involve a relatively complex process, and they require at least three photomasks which must be precisely aligned to ensure good quality. Furthermore, because the pigment dispersion method involves a free radical reaction to form a thermoset resin, a protective layer is required so as to avoid contact with oxygen.

U.S. Pat. No. 4,812,387, the content thereof is incorporated herein by reference, described an example of the electrodeposition coating process, by which a coating film is formed for filling the space between the color stripes for a color filter which is used for the colorization of a liquid crystal display. With the electrodeposition coating processes, a transparent electrode is prepared by patterning a transparent electrically conductive film (typically an indium-tin oxide, or ITO) which is deposited on a substrate and serves as an electrode, and an electric voltage is applied only to a portion of the patterned transparent electrode which is to be dyed in the same color. The substrate is then immersed in a coloring electrodeposition bath containing appropriate polymers and pigment dispersed in water, and a colored layer is formed by electrodeposition. Thereafter, electric voltage is applied only to another portion of the substrate which is to be dyed in a different color, and the substrate is then immersed in another colored electrodeposition bath for forming a different color layer via electrodeposition. This procedure is repeated until all the desired colored layers are formed. The disadvantages of the electrodeposition coating process are that it is necessary to perform a high precision patterning of the transparent electrode, and to pay meticulous attention during the subsequent process not to break the fine pattern, because otherwise, the subsequent coloring process will be rendered very difficult. The electrodeposition coating technique is limited in its applications because it requires a substrate with a stripe pattern of conductive (ITO) film (the stripe pattern consists of a plurality of segregated parallel lines) for implementation, and it typically cannot be used without the stripe patterns. Thus, the electrodeposition coating processes are suitable for the preparation of color filters for use in STN-LCDs, and have limited applications.

Among all the processes for preparing color filters, the printing process is the least expensive process. However, it suffers the problems of poor dimensional precision, smoothness, and reliability, and is not well accepted by the industry for making high quality electronic products.

Nippon Oil Company proposed an electrodeposition lithographic method (ED-litho) for making color filters which combined the electrodeposition (ED) coating method and the lithographic (litho) technique. In U.S. Pat. No. 5,214,542, the content thereof is incorporated herein by reference, Nippon Oil disclosed an electrodeposition lithographic method, which involves the steps of: (a) forming a photosensitive coating film on a transparent electrically conductive layer provided on an outermost surface of a substrate having an alignment film, (b) exposing the photosensitive coating film to light through a mask having patterns of at least three different degrees of light transmittances; (c) developing and removing a photosensitive coating film portion registering with one of the patterns of smallest and largest degrees of light transmittances to expose the transparent electrically conductive layer; (d) electrodepositing a colored coating on the exposed electrically conductive layer to form a colored layer thereon, and (e) repeating the step (d) for the respective patterns of different degrees of light transmittances in sequence of difference in light transmittances to form different colored layers, respectively. U.S. Pat. No. 5,214,541, the content thereof is incorporated herein by reference, discloses the additional step of transcribing the colored layers, the transparent electrically conductive layer, and the alignment film onto another substrate.

The electrodeposition lithographic method discussed above has several advantages in that: (1) high precision patterns can be obtained, better than that obtainable from the electrodeposition coating method; (2) the pattern figure has a high degree of freedom, and both stripe and non-stripe patterns can be provided; (3) because it utilizes the advantageous characteristics of electrodeposition process, the coated films exhibit uniform film thickness and excellent smoothness. However, the electrodeposition lithographic method requires developer solutions at least three different levels of concentrations so as to selectively remove the exposed photoresist at different stages of the development process, thus it allows only a relatively narrow process window within which tolerance is acceptable, and there exist only very limited options in selecting an appropriate photoresist. Additionally, only a limited number of options of photoresist-developer combinations can be utilized. This is especially true when a positive photoresist is used, in which only cationic electrodeposition resins can be used and anionic cannot be used.

If an anionic electrodeposition resin is used, then the basic developer solution can easily remove those acidic colored resins that have been electrodeposited but have not been hardened. This problem is further complicated by the fact that the colored resin cannot be hardened by light or heat during the electrodeposition lithographic process so as to ameliorate the problem caused by the uncured colored resin. Therefore, when the electrodeposition lithographic method is used, a positive photoresist must be used in conjunction with a cationic electrodeposition resin. Only negative photoresists can be used with an anionic electrodeposition resin; however, it is well known that negative photoresists do not provide the same dimensional precision as positive photoresists, and the trend in the industry is using positive photoresists. It is also well-known to those skilled in the art pertaining to pigment chemistry that cationic colored electrodeposition resins exhibit far superior characteristics, including stability (against decolorization), ease of emulsification, pigment dispersability (especially at high pigment concentrations), as well as lower raw material cost than their anionic counterparts. Thus the electrodeposition lithographic method disclosed in the prior art, which, almost by default, requires the combination of positive photoresist and anionic colored electrodeposition resin, does not represent the best, or the most desired, choice.

SUMMARY OF THE INVENTION

The primary object of the present invention is to develop an improved method for making color filters for use in light receiving surfaces such as flat panel displays and LCDs. More specifically, the primary object of the present invention is to develop an improved method for making high quality color filters using the combination of an energy-accumulable positive photoresist, a photocurable colored resin, and a multiple-incremental-exposure technique. With the method disclosed in the present invention, the pattern figure has a high degree of freedom and the manufacturing process does not require a very high degree of precision. The entire process can utilize the same developer solution throughout the various stages of the process, and a very large process window is allowed. The method disclosed in the present invention can also be implemented for making large area color filters.

The method disclosed in the present invention can be summarized using a preferred embodiment thereof which comprises the following steps:

(1) Forming an energy-accumulable positive photoresist layer on a transparent electrically conductive substrate, and exposing the photoresist layer to a light source so as to form three or four regions of different exposures having exposure energies of $D_1$, $D_2$, $D_3$, (and $D_4$), respectively, where $D_1 > D_2 > D_3 (> D_4)$, and $D_1$ represents the full exposure energy (i.e., energy required for full exposure in order to facilitate subsequent development). This step is called "pro-conditioning" of the photoresist, to form a plurality of regions of initially different exposure energies.

(2) Using an appropriate developer solution to remove the region of the photoresist layer with an initial exposure energy of $D_1$. Only this portion of the photoresist layer is removed, and, as a result, the corresponding area of the conductive substrate (i.e., underlying the $D_1$ region) is uncovered. This exposed area is electrodeposited with a photo-curable resin of desired color hue. This step is termed as n=1.

(3) Exposing the entire surface of the photoresist layer to an incremental exposure energy of $IE_n$, $IE_n$ ($=D_n - D_{n+1}$) is the gap, i.e., difference, between two adjacent exposure energies. This step increases the exposure energy received (through accumulation) by the entire photoresist layer by an incremental amount of $IE_n$. Thus, the region of the photoresist layer originally having an exposure energy of $D_2$ is now elevated to an exposure energy $D_1$ ($D_1=D_2+IE_1$). This allows the originally $D_2$ area (in step 1) to be developed by the same developer solution, and the newly uncovered area on the conductive substrate is electrodeposited with a photo-curable resin of another color. This step is described as n>1. This incremental exposure energy also causes the photo-curable resin to become hardened. These are the two important elements of the present invention.

(4) Repeating step 3 until all the thermosetting resins of desired colors are electrodeposited, respectively, on predetermined regions of the conductive substrate.

In step 1, a wide variety of conductive substrates can be utilized, including tin oxide, indium oxide, antimony oxide, or oxides of alloys of the tin, indium and/or antimony, such as indium tin oxide, ITO. Other commercially available electrically conductive glass can also be used in the present invention.

The positive photoresist to be used in step 1 must be energy-accumulable, so as to allow areas of different initial exposure energy to be progressively developed. A positive photoresist works based on the principle that its solubility increases after being exposed to photo energy, thus it becomes capable of being developed by a basic solution. The photoresist for use in the present invention preferably should have high contrast, so as to minimize the film loss (in terms of film thickness) in the unexposed or underexposed areas.

Many positive photoresists can be used in the present invention. These may include: (1) conventional positive photoresists; (2) positive electrodeposition photoresists; and (3) dyed or pigment-dispersed positive photoresists. Preferably, the photoresists require a full exposure energy of 80–1,500 mJ/cm$^2$. Typically, a positive photoresist contains a novolac resin and a photosensitive quinonediazide compound. However, combinations of other resins and/or photosensitive compounds can also be used. One key criterion of the present invention is that they must be energy accumulable. The photoresist layer can be formed using a variety of techniques. Instead of the electrodeposition technique, it can also be formed by spraying, dip coating, screen printing, roll coating, or spin coating. Preferably, the photoresist layer has a thickness of 1 to 10 μm, more preferably 2 to 5 μm. Three or four regions of different degrees of exposures can be formed on the coated photoresist layer, according to whether the color matrix includes a black matrix. The regional pattern can be stripe or non-stripe (such as mosaic or triangle, etc.).

If the color matrix (or color pattern) does not include a black color (i.e., black-hued layer), then three areas of different degrees of initial exposure energy are formed on the photoresist layer; the three levels of initial exposure energy are $D_1$, $D_2$, and $D_3$, representing 100–40%, 85–20%, and 70–0%, or more preferably, 100–70%, 70–40%, and 40–0%, respectively, of the energy required for full exposure. Overlapping of the ranges of the initial exposure energy is allowed, as long as they are designed such that only one region will be developed at one time. This embodiment is achieved by performing a photoresist pre-conditioning procedure (i.e., to form areas of varying degrees of light exposure on the photoresist layer) described above on a conductive substrate that is already provided with a black-hued layer. The black-hued layer is formed using alloys of chromium, nickel, etc, their oxides, or mixtures thereof. Alternatively, the black-hued layer can be formed from an organic polymeric coating composition containing black pigments dispersed therein. The black-hued layer can be permanently formed on the substrate, or it can be formed with a material that can be removed by the developer solution once it is exposed and brought in contact therewith.

The photoresist pre-conditioning procedure can be accomplished by a single exposure procedure using a photomask having multiple exposure density. Alternatively, it can be accomplished using a photomask having a predetermined exposure pattern, followed by careful movements of the photomask such that areas of different degrees of exposure are formed on the photoresist. Another alternative procedure is to use a plurality (three or four) of photomasks to form the desired three regions of different degrees of initial exposure energy which can be sequentially developed using the incremental exposure method disclosed in the present invention. After the pre-conditioning procedure and first development, the photo-curable resin containing the first coloring pigment (for example a red pigment) is electrodeposited onto the exposed area on the substrate (i.e., the area with the highest initial exposure energy, $D_1$). Thereafter, the entire photoresist layer is exposed to receive exposure energy $IE_1$, in the manner typically described as a "overall exposure" (non-discriminating exposure). This incremental exposure energy $IE_1$ (=$D_1-D_2$) raises the exposure energy of the region with the initial exposure energy of $D_2$ to $D_1$, thus allowing the initially $D_2$ region to be developed during the second development step; it also causes the first colored resin to be cured (hardened).

The second development procedure causes the originally $D_2$ region of the substrate to be uncovered, and the photo-curable resin containing the second coloring pigment (which can be a green pigment) is electrodeposited onto this newly exposed region. Another overall exposure imparts exposure energy $IE_2$ (=$D_2-D_3$) into the photoresist. This raises the exposure energy of the region with the initial exposure energy of $D_3$ to $D_1$, thus allowing the initially $D_3$ region to be developed during the third development step; it also causes the second colored resin to be cured. The third development step causes the originally $D_3$ region of the substrate to be uncovered, and the photo-curable resin containing a third coloring pigment (which can be a blue pigment) is then electrodeposited onto this newly exposed region. Finally, the entire surface of the photoresist is exposed to light to cause the resins to be completely hardened and ensure a firm fixation of the pigments.

If the color matrix includes a black matrix, or a black-hued layer (i.e., the black-hued matrix is already formed on the conductive substrate), then four areas of different degrees of initial exposure energy will be formed on the photoresist layer; these four levels of initial exposure energy are $D_1$, $D_2$, $D_3$, and $D_4$, representing 100–40%, 85–20%, 70–5%, and 50–0%, or more preferably, 100–80%, 80–50%, 50–30%, and 30–0%, respectively, of the energy required for full exposure. This embodiment is achieved by first performing a photoresist pre-conditioning procedure, followed by incremental exposure, sequential development and electrodeposition, similar to those steps described in the above discussed embodiment. However, because the composition of the black-hued layer may vary, three alternative procedures may be utilized. First, if the black-hued layer is made of a heat-curable resin containing a black-hued pigment, then the initially least exposed region (i.e., the initially $D_4$ region) is reserved for the black-hued layer (a colored layer also constitutes a "region", areally speaking, in the photoresist layer). The second option is to treat the black-hued layer as another colored layer, and electrodeposit the photo-curable black-hued resin on the selectively uncovered region on the substrate with a similar procedure. Thirdly, after the fourth region (i.e., the initially $D_4$ region) of the substrate is uncovered, the light-curable black-hued resin is coated onto the entire photoresist layer. Then, UV light is shined onto the conductive glass substrate from the other side (i.e., opposite the side of the photoresist). Because of the shielding effect provided by the red, blue, and green layers, only the black-hued resin in the fourth region will be hardened, and the uncured black-hued resin on the rest of the photoresist layer can be removed after the photo-initiated selective curing step.

Because the method of the present invention employs a positive photoresist in making the color filters, the developer solution typically contains a basic substance, such as sodium carbonate, sodium hydrogen carbonate, sodium metasilicate, tetraalkyl ammonium hydroxide, sodium hydroxide, potassium hydroxide, and mixtures thereof. Preferred concentration of the developer solution ranges from 0.2 to 4 wt %, and the preferred conditions for developing the exposed areas of the photoresist are at 15° to 40° C., for 5 to 600 seconds.

The colored electrodepositing resin comprises a light-curable charged resin and an appropriate coloring pigment (red, green, or blue) dispersed therein. The charged photo-curable resin can be an anionic or cationic resin. An anionic colored resin contains an anionically charged resin, a photosensitive monomer (typically a monomer containing at least an unsaturated double bond), a photopolymerization initiator (0.1–30%), solvent, and water. The anionic resin can be an acrylic resin that contains an acid group (carboxylic or sulfonic group) solubilized and/or dispersed in ammonia, trimethylamine, triethylamine, diethylamine, dimethyl ethanol amine, and/or diethyl ethanol amine. Preferably, the mount of exposure energy required for curing a light-curable anionic resin is about 20–500 mJ/cm$^2$, more preferably about 50–350 mJ/cm$^2$. A cationic colored resin typically comprises an acrylic resin containing a tertiary or quaternary amine solubilized and/or dispersed in a neutralizing agent such as formic acid, acetic acid, propionic acid, or lactic acid. Preferably, the amount of exposure energy required for curing the light-curable cationic resin is about 20–800 mJ/cm$^2$, more preferably about 50–650 mJ/cm$^2$. It is also possible to prepare the electrodepositing colored resin using a heat-curable cationic resin with pigment dispersed therein which is comprised of a cationic resin, a heat-curing agent, solvent, and water. It is preferred that the electrodeposition be performed at about 30° C. and a voltage of 10–50 V, for 30–180 seconds. It is also preferred that the electrodeposited layer has a thickness of about 0.5–3 μm While both anionic and cationic light-curable resins can be used in the present invention, at the present time, the known anionic resins exhibit superior characteristics, such as stability (against yellowing colorization), easy of emulsification, and pigment dispersability (especially at high concentrations), than cationic resins, and can be provided at a substantially lower cost. Thus, it is preferred in the present invention, at least under the state of today's technology, to use positive photoresist in conjunction with anionic photo-curable resins to prepare high quality color filters.

The coloring agent for use in the present invention can be a dye, a pigment, or a mixture thereof. Typically, an appropriate dye can be selected from the group consisting of azo dyes, anthraquinone dyes, benzodifuranone dyes, condensed methine dyes, and mixtures thereof. The pigment can be selected from the group consisting of azo lake organic pigments, quinacridone organic pigments, phthalocyanine organic pigments, isoindolinone organic pigments, anthraquinone organic pigments, thioindigo organic pigments, chrome yellow, chrome blue, iron oxide, chrome vermilion, chrome green, ultramarine, prussian blue, cobalt green, emerald green, titanium white, carbon black, and mixtures thereof. A dye can be totally solubilized in a resin without causing dispersion problems. On the other hand, a pigment can only be dispersed in a resin, and therefore, the particle size of the pigment typically cannot be greater than 0.2 μm. The amount of the coloring agent depends on the desired color hue. Preferably, the amount of the coloring agent should constitute about 3–70 wt %, or more preferably about 5–60 wt %, of the total solid.

The substrate used in the electrodeposition process comprises an electrically conductive glass, or an electrically conductive glass with a black-hued light-shielding layer having a predefined pattern. The black-hued layer, which is a photoresist itself, can be made from metal films, such as chromium and nickel alloys or oxides thereof, or a black-hued organic polymer coating, such as acrylic resin, epoxy resin, etc. The light-shielding material in the black-hued photoresist layer can be a light-shielding pigment, such as carbon black, or a light-shielding filler, such as titanium oxide.

During the electrodeposition of anionic colored resin, because of the presence of acid groups contained therein, some of the resin before hardening will dissolve into the basic developer solution still associated with the photoresist. This can often cause the electrodeposited resin to be peeled off during the next development step. This problem is complicated by the fact that the energy-accumulable positive photoresist typically cannot be further developed if heated. Thus, the anionic colored resin cannot be cured by heat. As a result, the anionic electrodepositing colored resin must be photosensitive and photo-curable so that they can be cured before the subsequent development stage. However, careful consideration must be given between the exposure energy required for full exposure of the photoresist, designated as E, and the exposure energy required for curing the anionic electrodepositing colored resin, designated as R. Therefore, in designing an N-stage incremental exposure process of the present invention, the full exposure energy E must be equal to or greater than (N-1) times the curing energy R; i.e.:

$$E \geq (N-1) \times R$$

Thus, for a three-stage incremental exposure process, the photoresist and the light-curable resin must be selected such that E is at least twice as much as R (or R must be no greater than one half of E). For a four-stage incremental exposure process, the photoresist and the light-curable resin must be selected such that E is at least three times as much as R (or R must be no greater than one third of E). Different photo-curable resins can be used each with a unique value of R. However, one of the advantages of the present invention is that the same photo-curable resin can be used for electrodepositing all the desired colored layers, and the same developer solution can be used.

Another important consideration in designing the process of the present invention is that, although, theoretically speaking, the exposure energy at the n-th stage $IE_n$ ($IE$ stands for "incremental energy") can be arbitrarily chosen, in reality, every $IE_n$ must be greater than R so as to ensure that the electrodeposited colored resin is fully hardened and will not be affected by subsequent development, before proceeding to the next stage.

Because cationic resins do not contain acid groups, some of the above limitations do not apply. While the cationic resins are not preferred in the present invention, unlike the anionic resins, they do not need to be hardened before development of the photoresist layer. Cationic resins can be cured at once after the completion of the development process of the photoresist.

Another consideration in designing the process disclosed in the present invention is that the incremental exposure energy for each stage must exhibit the required discrimination. In other words, the incremental exposure energy at the n-th stage, $IE_n$, must allow one and only one region to reach the full exposure energy. It is permissible for the accumulated energy in one region to exceed the full exposure energy, i.e.:

Condition 1:

$$IE_n \geq D_n - D_{n+1} (\text{i.e., } D_{n+1} + IE_n \geq D_n)$$

But another condition must also be satisfied so as to ensure discrimination:

Condition 2:

$$IE_n < D_n - D_{n+2} (\text{i.e., } D_{n+2} + IE_n < D_n)$$

The first condition allows the originally $D_{n+1}$ region to be fully exposed; whereas the second condition prevents the $D_{n+2}$ to be developed, thus discrimination is ensured.

A range of the initial exposure energy $D_1$'s are provided in the above described embodiments, from 100–40% of the full exposure energy, because the full exposure energy E typically is measured at a standard condition, and the actual full exposure energy required may be different, typically lower, at the processing condition. When the value of $D_1$ is not adequate for development, then an overall exposure can be applied to raise the entire $D_n$'s to a different level. On the other hand, the condition that $D_1$=(100% full exposure energy) can be interpreted as that $D_1$ is equal to or greater than full exposure energy.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
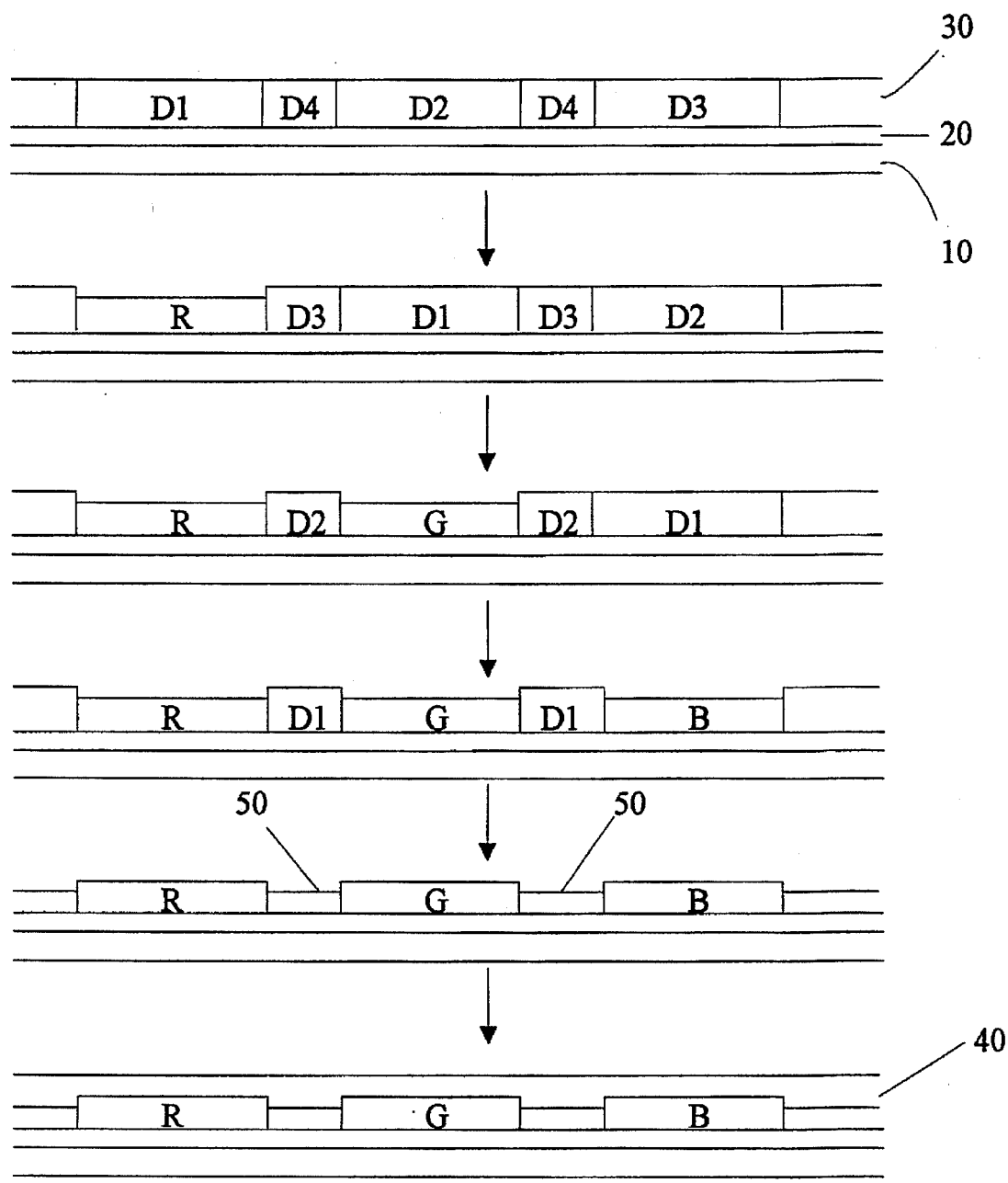
FIG. 1 is schematic diagram showing the various stages of a preferred embodiment of the process disclosed in the present invention.

The present invention discloses an improved method for making color filters for use in light receiving surfaces such as flat panel displays and LCDs by utilizing a combination of an energy-accumulable positive photoresist and a photo-curable colored resin in accordance with a novel multiple incremental-exposure procedure. The process disclosed in the present invention can utilize the same developer solution throughout the various stages of the process, and a very large process window is allowed.

The method disclosed in the present invention mainly comprises the steps of (1) pre-conditioning the energy-accumulable photoresist to form at least three regions of different initial exposure energies; (2) using a developer solution to remove the region of the photoresist with the highest amount of initial exposure energy and cause the corresponding area of the electrically conductive substrate underlying this fully exposed region photoresist to be uncovered; (3) electrodepositing a photo-curable resin of a desired color onto the uncovered area of the substrate; (4) exposing the entire area of the photoresist layer to a light source so as to impart an incremental exposure energy to all the regions of the photoresist layer, the incremental exposure energy is provided such that the region with the next highest initial exposure energy now can be developed, and, at the same time, the photo-curable resin becomes hardened as a result of this incremental exposure energy; (5) using a developer solution to remove the region of the photoresist which has accumulated full exposure energy in step 4 and uncover the corresponding area on the substrate; (6) electrodepositing a photo-curable resin of another desired color onto the uncovered area of the substrate; (7) repeating steps 4 through 6 until all the desired colored layers are selectively developed on the substrate.

A wide variety of electrically conductive substrates can be utilized in the present invention; these include tin oxide, indium oxide, antimony oxide, or oxides of alloys of the tin, indium and/or antimony, such as indium tin oxide, "ITO". Other commercially available electrically conductive glass can also be used in the present invention.

A positive photoresist works based on the principle that its solubility increases after being exposed to photo energy, thus becoming capable of being developed by a basic solution. Typically, a positive photoresist contains a novolac resin and a photosensitive quinonediazide compound. However, combinations of other resins and/or photosensitive compounds can also be used. The photoresist for use in the present invention preferably should have high contrast, so as to minimize the film loss (in terms of film thickness) in the unexposed or underexposed areas. One of the key elements of the present invention is that the positive photoresist to be used in step must be energy-accumulable, so as to allow areas of different initial exposure energy to be progressively developed. Many positive photoresists can be used in the present invention, including: (1) conventional positive photoresists; (2) positive electrodeposition photoresists; and (3) dyed or pigment-dispersed positive photoresists. Preferably, the photoresists are that which require a full exposure energy of 80–1,500 mJ/cm$^2$. The photoresist layer can be formed on the conductive substrate using a variety of techniques. Instead of the electrodeposition technique, it can also be formed by spraying, dip coating, screen printing, roll coating, spin coating. Preferably, the photoresist layer has a thickness of 1 to 10 µm, more preferably 2 to 5 µm. Three or four regions of different degrees of exposures can be formed on the coated photoresist layer, according to the design of the pigment and black matrix. The regional pattern can be stripe or non-stripe (such as mosaic or triangle, etc.).

The pre-conditioning of the photoresist can be accomplished by several methods. It can be done via a single exposure step using a photomask having multiple exposure density. Alternatively, it can be accomplished using a photomask having a predetermined exposure pattern. By careful movements of the photomask, areas of different degrees of exposure energy can be formed on the photoresist. Another alternative procedure is to use a plurality (three or four) of photomasks to form the desired three regions of different degrees of initial exposure energy which can be sequentially developed using the incremental exposure method disclosed in the present invention. After the pre-conditioning procedure, the photo-curable resin containing the first coloring pigment (for example a red pigment) is electrodeposited onto the exposed area on the substrate (i.e., the area with the highest initial exposure energy). Thereafter, the entire photoresist layer is exposed non-discriminatingly to a light source to receive an incremental exposure energy in the manner typically described as an "overall exposure". This incremental exposure energy raises the exposure energy of the region with the next highest initial exposure energy to the full exposure energy. This step allows the region with the second highest exposure energy to be developed during the second development step; it also causes the first colored resin to be cured (hardened).

If the color matrix (or color pattern) to be formed does not include a black color (i.e., black-hued layer), then three areas of different degrees of initial exposure energy are formed on the photoresist layer; the three levels of initial exposure energy can be about 100–40%, 85–20%, and 70–0%, or preferably, 100–70%, 70–40%, and 40–0%, respectively, of the energy required for full exposure. Because the full exposure energy E is typically measured at a standard condition, and the actual energy required for full exposure may be different, typically lower, at the processing condition than this standard value. Thus, the region with the highest amount of initial exposure energy can be lower than the standard full exposure energy. When the value of highest initial exposure is not adequate for development, then an overall exposure can be applied to raise the entire regions to a different level. On the other hand, the condition that the initial exposure equals 100% of full exposure can be interpreted including the condition of being greater. Overlapping of the ranges of the initial exposure energy is allowed, as long as they are designed such that only one region will be developed at one time.

After the anionic colored resin is electrodeposited but before it is cured, the acid groups contained in an uncured resin will react with the basic developer solution during the next development step, causing the electrodeposited resin to be peeled off. As it was discussed earlier, the energy-accumulable positive photoresist typically cannot be further developed if heated. Thus, the anionic colored resin to be used in the present invention must be photosensitive and photo-curable. Careful consideration must be given between the exposure energy E required for full exposure of the photoresist and the exposure energy required for curing the anionic electrodepositing colored resin R. Therefore, in designing an N-stage incremental exposure process of the present invention, the full exposure energy E must be equal to or greater than (N−1) times the curing energy R; i.e.:

$$E \geq \Sigma R$$

If the same photo-curable resin is used for all the colored layers, the above equation is reduced to the following formula:

$$E \geq (N-1)R$$

Thus, for a three-stage incremental exposure process, the photoresist and the light-curable resin must be selected such that E is at least twice as much as R (or R must be no greater than one half of E). For a four-stage incremental exposure process, the photoresist and the light-curable resin must be selected such that E is at least three times as much as R (or R must be no greater than one third of E). Different photo-curable resins can be used each with a unique R. However, one of the advantages of the present invention is that the same photo-curable resin can be used for electrodepositing all the desired colored layers. Furthermore, although the incremental exposure energy at each stage can be, theoretically speaking, arbitrarily chosen (as long as one region will become developable), in reality, it must be greater than R so as to ensure that the electrodeposited colored resin can be fully hardened and will not be affected by subsequent development, before proceeding to the next stage.

In a preferred embodiment of the present invention, a high quality color filter is formed according to the following steps:

(1) Forming an energy-accumulable positive photoresist layer on a transparent electrically conductive substrate, and precondition the photoresist layer by exposing the photoresist layer to a light source so as to form at least three regions of different initial exposure energies of $D_n$, n=1∝3, respectively, where $D_n > D_{n+1}$, and $D_1$ represents the full exposure energy at the processing condition.

(2) Using a developer solution to remove the region of the photoresist layer with an initial exposure energy of $D_1$ and uncover the corresponding area of the conductive substrate underlying the $D_1$ region.

(3) Electrodepositing the uncovered area with a photo-curable resin of the desired color hue.

(4) Overall-exposing the entire surface of the photoresist layer to a light source so as to impart an incremental exposure energy of $IE_n$, ($IE_n = D_n - D_{n+1}$) is the gap, i.e., difference, between two adjacent exposure energies. This step increases the exposure energy received (through accumulation) by the entire photoresist layer by an incremental amount of $IE_n$. Thus, the region of the photoresist layer originally having an exposure energy of $D_2$ is now elevated to an exposure energy $D_1 (D_1 = D_2 + IE_1)$. This allows the originally $D_2$ area (in step 1) to be developed by the same developer solution, and the newly uncovered area on the conductive substrate is electrodeposited with a photo-curable resin of another color. This step is described as n>1. This incremental exposure energy also causes the photo-curable resin to become hardened. Both are two important elements of the present invention.

(5) Using the same developer solution to remove the region of the photoresist layer with the next highest initial exposure energy and uncover the corresponding underlying area on the conductive substrate.

(6) Repeating steps 4 and 5 until all the desired colors layers are electrodeposited, respectively, on predetermined regions of the conductive substrate.

The second development procedure in Steps 4 through 6 causes the originally $D_2$ region of the substrate to be uncovered, and the photo-curable resin containing the second coloring pigment (which can be a green pigment) is electrodeposited onto this newly exposed region. Then, another overall exposure imparts exposure energy $IE_2 (= D_2 - D_3)$ into the photoresist. This raises the exposure energy of the region with the initial exposure energy of $D_3$ to $D_1$, thus allowing the initially $D_3$ region to be developed during the third development step; it also causes the second colored resin to be cured. The third development step causes the originally $D_3$ region of the substrate to be uncovered, and the photo-curable resin containing a third coloring pigment (which can be a blue pigment) is then electrodeposited onto this newly exposed region. Finally, the entire surface of the photoresist is exposed to light, to cause the resins to be completely hardened and ensure a firm fixation of the pigments.

In the embodiment described above, the conductive substrate that is already provided with a black-hued layer, which is formed using alloys of chromium, nickel, etc, their oxides, or mixtures thereof. Alternatively, it can be formed from an organic polymeric coating composition containing black pigments dispersed therein. The black-hued layer can be removed by the developer solution once it is brought in contact therewith.

In another embodiment of the present invention, the color matrix to be formed on the conductive substrate includes a black matrix, or a black-hued layer, and four areas of different degrees of initial exposure energy are formed on the photoresist layer; these four levels of initial exposure energy are $D_1$, $D_2$, $D_3$, and $D_4$, representing 100–40%, 85–20%, 75–5%, and 50–0%, or more preferably, 100–80%, 80–50%, 50–30%, and 30–0%, respectively, of the energy required for full exposure. This embodiment is achieved by first performing a photoresist pre-conditioning procedure, followed by incremental exposure, sequential development and electrodeposition, similar to those steps described in the above discussed embodiment. However, because the composition of the black-hued layer may vary, three alternative procedures may be utilized. First, if the black-hued layer is made of a heat-curable resin containing a black-hued pigment, then the initially least exposed region (i.e., the initially $D_4$ region) is reserved for the black-hued layer (a colored layer also constitutes a "region", areally speaking, in the photoresist layer). The second alternative is to treat the black-hued layer as another colored layer, and electrodeposit the photo-curable black-hued resin on the selectively uncovered region on the substrate with a similar procedure. Thirdly, after the fourth region (i.e., the initially $D_4$ region) of the substrate is uncovered, the light-curable black-hued resin is coated onto the entire photoresist layer. Then, UV light is shined onto the conductive glass substrate from the other side (i.e., opposite the side of the photoresist). Because of the shielding effect provided by the red, blue, and green layers, only the black-hued resin in the fourth region will be hardened, and the uncured black-hued resin on the rest of the photoresist layer can be removed after the photo-initiated selective curing step.

In both embodiments, the following conditions must be met:

Condition 1:

$$IE_n \geq D_n - D_{n+1} (\text{i.e.}, D_{n+1} + IE_n \geq D_n)$$

Condition 2:

$$IE_n < D_n - D_{n+2} (\text{i.e.}, D_{n+2} + IE_n < D_n)$$

The first condition allows the originally $D_{n+1}$ region to be fully exposed; whereas the second condition prevents the $D_{n+2}$ region to be developed, i.e., to ensure a discriminatory development (i.e., only one region can be developed during each development stage).

The developer solution used in the present invention preferably contains a basic substance, such as sodium carbonate, sodium hydrogen carbonate, sodium metasilicate, tetraalkyl ammonium hydroxide, sodium hydroxide, potassium hydroxide, and mixtures thereof. Preferred concentrations of the developer solution range from 0.2 to 4 wt %, and the preferred conditions for developing the exposed areas of the photoresist are at 15° to 40° C., for 5 to 600 seconds.

Preferably, the colored electrodepositing resin comprises a light-curable charged resin and an appropriate coloring agent (red, green, or blue) dispersed therein. The charged photo-curable resin can be an anionic or cationic resin. An anionic colored resin contains an anionic charged resin, a photosensitive monomer (typically a monomer containing at least an unsaturated double bond), a photopolymerization initiator (0.1–30%), solvent, and water. The anionic resin can be an acrylic resin that contains an acid group (carboxylic or sulfonic group) solubilized and/or dispersed in ammonia, trimethylamine, diethylamine, dimethyl ethanol amine, and/or diethyl ethanol amine. Preferably, the amount of exposure energy required for curing a light-curable anionic resin is about 20–500 mJ/cm$^2$, more preferably about 50–350 mJ/cm$^2$. A cationic colored resin typically comprises an acrylic resin containing a tertiary or quaternary amine solubilized and/or dispersed in a neutralizing agent such as formic acid, acetic acid, propionic acid, or latic acid. Preferably, the amount of exposure energy required for curing the light-curable cationic resin is about 20–800 mJ/cm$^2$, more preferably about 50–650 mJ/cm$^2$. It is also possible to prepare the electrodepositing colored resin using a heat-curable cationic resin with pigment dispersed therein which is comprised of a cationic resin, a heat-curing agent, solvent, and water. It is preferred that the electrodeposition be performed at about 30° C. and a voltage of 10–50 V, for 30–180 seconds. It is also preferred that the electrodeposited layer has a thickness of about 0.5–3 µm. While both anionic and cationic light-curable resins can be used in the present invention, at the present time, the known anionic resins exhibit superior characteristics, such as stability (against yellowing colorization), easy of emulsification, and pigment dispersability (especially at high concentrations), than cationic resins, and can be provided at a substantially lower cost. Thus, it is preferred in the present invention, at least under the state of today's technology, to use positive photoresist in conjunction with anionic photo-curable resins to prepare high quality color filters.

The coloring agent for use in the present invention can be a dye, pigment, or a mixture thereof. Typically, an appropriate dye can be selected from the group consisting of azo dyes, anthraquinone dyes, benzodifuranone dyes, condensed methine dyes, and mixtures thereof. The pigment can be selected from the group consisting of azo lake organic pigments, quinacridone organic pigments, phthalocyanine organic pigments, isoindolinone organic pigments, anthraquinone organic pigments, thioindigo organic pigments, chrome yellow, chrome blue, iron oxide, chrome vermilion, chrome green, ultramarine, prussian blue, cobalt green, emerald green, titanium white, carbon black, and mixtures thereof. A dye can be totally solubilized in a resin without causing dispersion problems. On the other hand, a pigment can only be dispersed in a resin, and therefore, the particle size of the pigment typically cannot be greater than 0.2 µm. The amount of the coloring agent depends on the desired color hue. Preferably, the amount of the coloring agent should constitute about 3–70 wt %, or more preferably about 5–60 wt %, of the total solid.

The substrate used in the electrodeposition process comprises an electrically conductive glass, or an electrically conductive glass with a black-hued light-shielding layer having a predefined pattern. The black-hued layer, which is a photoresist itself, can be made from metal films, such as chromium and nickel alloys or oxides thereof, or a black-hued organic polymer coating, such as acrylic resin, epoxy resin, etc. The light-shielding material in the black-hued photoresist layer can be a light-shielding pigment, such as carbon black, or a light-shielding filler, such as titanium oxide.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A positive photoresist 2.2 μm thick was formed on an electrically conductive transparent glass substrate, which was measured 1.1 mm in thickness and contained a black-hued matrix. The photoresist contained a mixture of (1) 100 parts by weight of a novolac resin having a weight average molecular weight of 40,000 prepared from a monomer composition of cresol/formaldehyde=1:0.82; (2) 25 parts by weight of a photoactive compound, 2,3,4-trihydroxy benzophenone/-naphthoquinone diazide-5-sulsonyl chloride (1/2.0); and (3) 360 parts by weight of cellosolve acetate. By carefully moving a photomask, which has one-third of light transmitting areas, three regions—first, second, and third—having initial exposure energies of 300, 165, and 30 mJ/cm$^2$ (representing 100%, 55%, and 10%, respectively, of the photo energy required for full exposure) were formed.

A developer solution containing 0.5% $Na_2SiO_3$ was used to develop and remove the 300 mJ/cm$^2$ initial exposure region (i.e., 100% initial exposure region). Therefore, a photo-curable resin containing a red pigment was electrodeposited onto the exposed surface of the conductive substrate. The photo-curable resin contained (1) 100 parts by weight of an anion resin; (2) 20 parts by weight of trimethylolpropane triacrylate; (3) 5 parts by weight of benzyl dimethyl ketal; (4) 10 parts by weight of n-butanol; (5) 20 parts by weight of isopropanol; (6) 1,635 parts by weight of deionized water; and (7) 100% of trimethylamine required for neutralization. The red pigment was C.I. pigment red 177, constituting 60 parts by weight of the total resin. The anionic resin contained the following ingredients (all parts were by weight): (1) 104 parts of methyl methacrylate; (2) 72 parts acrylic acid; (3) 177 parts of hydroxy ethyl acrylate; (4) 150 parts ethyl acrylate; and (5) 503 parts cellosolve acetate. The electrodeposition process was conducted at 30° C. at an electrical voltage of 20 V, for 90 seconds.

The entire photoresist was then exposed to a light source to receive 135 mJ/cm$^2$ incremental exposure energy. This caused the cumulative exposure energy in the second (initially 165 mJ/cm$^2$, or 55% initial exposure energy) and third (initially 30 mJ/cm$^2$, or 10% initial exposure energy) to raise to 300 mJ/cm$^2$ (full exposure) and 165 mJ/cm$^2$ (55% of full exposure), respectively. This incremental exposure energy also caused the red-colored resin to be hardened.

The same developer solution coming 0.5% $Na_2SiO_3$ was then used to develop and remove the 165 mJ/cm$^2$ initial exposure region (now 300 mJ/cm$^2$). This was followed by electrodepositing under a similar condition a photo-curable resin containing a green pigment (C. I. pigment green 7, 70 parts by weight) onto the exposed surface of the conductive substrate.

Again, the entire photoresist was exposed to a light source to receive another 135 mJ/cm$^2$ of incremental exposure energy. This caused the cumulative exposure energy in the third (initially 30 mJ/cm$^2$, now 165 mJ/cm$^2$) to raise to 300 mJ/cm$^2$ (full exposure). This incremental exposure energy also caused the green-colored resin to be hardened.

The 30 mJ/cm$^2$ initial exposure region (now 300 mJ/cm$^2$) was developed and removed using the same developer solution containing 0.5% $Na_2SiO_3$. This was again followed by electrodepositing under a similar condition a photo-curable resin containing a blue pigment (C. I. pigment blue 15:3, 50 parts by weight) onto the exposed surface of the conductive substrate. Finally, the entire photoresist was exposed to receive another 135 mJ/cm$^2$ of exposure energy to cause the blue-colored resin to be hardened. To ensure complete curing of all the colored layers, the photoresist was heated at 200° C. for one hour.

EXAMPLE 2

A positive photoresist with a thickness of 2.2 μm was formed on an electrically conductive transparent glass substrate, which was measured 1.1 mm in thickness and contained a black-hued matrix. The photoresist contained a mixture of (1) 100 parts by weight of a novolac resin having a weight average molecular weight of 40,000 prepared from a monomer composition of cresol/formaldehyde=1:0.82; (2) 30 parts by weight of a photoactive compound, 2,3,4-trihydroxy benzophenone/-naphthoquinone diazide-5-sulsonyl chloride (1/2.5); and (3) 390 parts by weight of cellosolve acetate. By carefully moving a photomask, which had one-fourth light transmitting area, four regions—first, second, third, and fourth—having initial exposure energies of 500, 350, 200, and 50 mJ/cm$^2$ (representing 100%, 70%, 40%, and 10%, respectively, of the photo energy required for full exposure of the photoresist) were formed.

A developer solution containing 0.5% $Na_2SiO_3$ was used to develop and remove the 500 mJ/cm$^2$ initial exposure region (i.e., 100% initial exposure region). Therefore, the same photo-curable resin as in Example 1 containing the red pigment was electrodeposited onto the exposed surface of the conductive substrate. The electrodeposition process was conducted at 30° C. at an electrical voltage of 20 V, for 90 seconds.

The entire photoresist was exposed to a light source to receive 150 mJ/cm$^2$ of incremental exposure energy. This caused the cumulative exposure energy in the second (initially 350 mJ/cm$^2$, or 70% initial exposure energy), third (initially 200 mJ/cm$^2$, or 40% initial exposure energy), and fourth (initially 50 mJ/cm$^2$, or 10% initial exposure energy) to raise to 500 mJ/cm$^2$ (full exposure), 350 mJ/cm$^2$ (70% of full exposure), and 200 mJ/cm$^2$ (40% of full exposure), respectively. This incremental exposure energy also caused the red-colored resin to be hardened.

The same developer solution containing 0.5% $Na_2SiO_3$ was then used to develop and remove the initially 350 mJ/cm$^2$ exposure region (now 500 mJ/cm$^2$). This was followed by electrodepositing under a similar condition the photo-curable resin containing the green pigment onto the exposed surface of the conductive substrate.

After the second development, the entire photoresist was exposed to a light source to receive another 150 mJ/cm$^2$ of incremental exposure energy. This caused the cumulative exposure energy in the third (now having 350 mJ/cm$^2$ of exposure energy), and fourth (now having 200 mJ/cm$^2$ of exposure energy) to raise to 500 mJ/cm$^2$ (full exposure) and 350 mJ/cm$^2$ (70% of full exposure), respectively. This incremental exposure energy caused the green-colored resin to be hardened.

Again, the same developer solution containing 0.5% $Na_2SiO_3$ was then used to develop and remove the initially 200 mJ/cm$^2$ exposure region (now 500 mJ/cm$^2$). This was followed by electrodepositing under a similar condition the photo-curable resin containing the blue pigment onto the exposed surface of the conductive substrate.

After the third development, again, the entire photoresist was exposed to a light source to receive, for the third time, another 150 mJ/cm$^2$ of incremental exposure energy. This caused the cumulative exposure energy in the fourth (now 350 mJ/cm$^2$) to raise to 500 mJ/cm$^2$. This incremental exposure energy also caused the blue-colored resin to be hardened.

The initially 50 mJ/cm² exposure region (now 500 mJ/cm²) was developed and removed using the same developer solution containing 0.5% $Na_2SiO_3$. This was again followed by electrodepositing under a similar condition the photo-curable resin containing a black pigment (carbon black 50 parts by weight) onto the exposed surface of the conductive substrate. Finally, the entire photoresist was exposed to receive another 150 mJ/cm² of exposure energy to cause the black-colored resin to be hardened. The photoresist was heated at 200° C. for one hour to ensure complete curing of all the colored layers.

EXAMPLE 3

A positive photoresist with a thickness of 2.2 μm was formed on an electrically conductive transparent glass substrate, which was measured 1.1 mm in thickness and contained a black-hued matrix. The photoresist contained a mixture of (1) 100 parts by weight of a novolac resin having a weight average molecular weight of 40,000 prepared from a monomer composition of cresol/formaldehyde=1:0.82; (2) 30 parts by weight of a photoactive compound, 2,3,4-trihydroxy benzophenone/-naphthoquinone diazide-5-sulsonyl chloride (1/2.5); (3) 33 parts by weight of carbon black; and (4) 490 parts by weight of cellosolve acetate. By carefully moving a photomask, which had one-fourth light transmitting area, four regions—first, second, third, and fourth—having initial exposure energies of 600, 420, 240, and 60 mJ/cm² (representing 100%, 70%, 40%, and 10%, respectively, of the photo energy required for full exposure of the photoresist) were formed.

A developer solution containing 0.5% $Na_2SiO_3$ was used to develop and remove the 600 mJ/cm² initial exposure region (i.e., 100% initial exposure region). Therefore, the same photo-curable resin as in Example 1 containing the red pigment was electrodeposited onto the exposed surface of the conductive substrate. The electrodeposition process was conducted at 30° C. at an electrical voltage of 20 V, for 90 seconds. The entire photoresist was exposed to a light source to receive 180 mJ/cm² of an incremental exposure energy. This caused the cumulative exposure energy in the second (initially 420 mJ/cm², or 70% of initial exposure energy), third (initially 240 mJ/cm², or 40% of initial exposure energy), and fourth (initially 60 mJ/cm², or 10% of initial exposure energy) to raise to 600 mJ/cm² (full exposure), 420 mJ/cm² (70% of full exposure), and 240 mJ/cm² (40% of full exposure), respectively. This incremental exposure energy also caused the red-colored resin to be hardened. The same developer solution containing 0.5% $Na_2SiO_3$ was then used to develop and remove the initially 420 mJ/cm² exposure region (now 600 mJ/cm²). This was followed by electrodepositing under a similar condition the photo-curable resin containing the green pigment onto the exposed surface of the conductive substrate.

After the second development, the entire photoresist was exposed to a light source to receive another 180 mJ/cm² of incremental exposure energy. This caused the cumulative exposure energy in the third (now having 420 mJ/cm² of exposure energy), and fourth (now having 240 mJ/cm² of exposure energy) to raise to 600 mJ/cm² (full exposure) and 420 mJ/cm² (70% of full exposure), respectively. This incremental exposure energy caused the green-colored resin to be hardened. Again, the same developer solution containing 0.5% $Na_2SiO_3$ was then used to develop and remove the initially 240 mJ/cm² exposure region (now 600 mJ/cm²). This was followed by electrodepositing under a similar condition the photo-curable resin containing the blue pigment onto the exposed surface of the conductive substrate.

After the third development, again, the entire photoresist was exposed to a light source to receive, for the third time, another 180 mJ/cm² of incremental exposure energy. This caused the cumulative exposure energy in the fourth (now 420 mJ/cm²) to raise to 600 mJ/cm². This incremental exposure energy also caused the blue-colored resin to be hardened. Because the black pigment (carbon black) was already contained in the photoresist, the initially 60 mJ/cm² exposure region (now 600 mJ/cm²) did not need to be removed by the developer solution. Rather, it was hardened along with the blue-colored layer. Finally, the photoresist was heated at 200° C. for one hour to ensure complete curing of all the colored layers.

FIG. 1 is schematic diagram showing the various stages of a preferred embodiment of the process disclosed in the present invention having four regions of initial exposures ($D_1$ through $D_4$). A positive photoresist 30 is formed on a conductive substrate comprising an ITO layer 20 on glass 10. After the pre-condition stage, exposure regions $D_1$ through $D_4$ are formed. After development, electrodepositing with a red-colored resin, and overall exposure with $IE_n$ (here n=1), a red layer (R) is formed and the energies of the exposure regions $D_2$ through $D_4$ are upgraded to $D_1$ through $D_3$, respectively. The steps of development, electrodepositing with a colored resin (green or blue), and overall exposure with $IE_n$ are repeated for the deposition of green (G) and blue (B) resins. Finally the originally $D_4$ (now $D_1$) region is developed and deposited with a black-hued resin 50. After another overall exposure, a protective coating layer 40 is formed on the entire surface of the substrate covering all the colored layers, R (red), B (blue), G (green), and the black matrix 50.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairy, legally, and equitably entitled.

What is claimed is:

1. A method for making color filters containing a color matrix with at least three desired colored layers comprising the steps of:

(a) forming a positive energy-accumulable photoresist layer on a transparent electrically conductive substrate;

(b) pre-conditioning said energy-accumulable photoresist layer to form at least three regions of different initial levels of exposure energy, from a highest to a lowest;

(c) using a first developer solution to develop and remove the region of the photoresist layer with the highest level of initial exposure energy to thereby cause a corresponding area of said electrically conductive substrate underlying said photoresist to be uncovered;

(d) electrodepositing a photo-curable resin of a desired color onto said uncovered area of the substrate, said photo-curable resin requires a predetermined amount of exposure energy for curing;

(e) overall-exposing said photoresist layer to a light source so as to impart an incremental exposure energy to all regions of said photoresist layer, wherein said incremental exposure energy satisfies the following two conditions:
- (i) it enables a region with a next highest initial exposure energy to attain full exposure energy for subsequent development, and
- (ii) it equals or exceeds said exposure energy required for curing said photo-curable resin electrodeposited in step (d) to thereby cause said photo-curable resin to become hardened;

(f) using a second developer solution, which can be the same of different from said first developer solution, to develop and remove the region of said photoresist layer that has accumulatively attained said full exposure energy in step (e) and uncover a corresponding area of said substrate;

(g) electrodepositing a photo-curable resin of another desired color onto the uncovered area of said substrate uncovered in step (f); and (h) repeating steps (e) through (g) until all said desired colored layers are selectively developed on the substrate.

2. A method for making color filters according to claim 1 wherein said transparent electrically conductive substrate comprises a transparent glass substrate having an electrically conductive film provided thereon, said electrically conductive film is made of a material selected from the group consisting of: tin oxide, indium oxide, antimony oxide, oxides of alloys of tin, indium, and/or antimony, and mixtures thereof.

3. A method for making color filters according to claim 1 wherein said photoresist layer comprises a novolac resin and a photosensitive quinonediazide compound dispersed therein.

4. A method for making color filters according to claim 1 wherein said pre-conditioning step causes three regions of different initial levels of exposure energy, at about 120–40%, 85–20%, and 70–0%, respectively, of said energy required for full exposure, on said photoresist layer.

5. A method for making color filters according to claim 1 wherein said pre-conditioning step causes three regions of different initial levels of exposure energy, at about 100–70%, 70–40%, and 40–0%, respectively, of said energy required for full exposure, on said photoresist layer.

6. A method for making color filters according to claim 1 wherein said pre-conditioning step causes four regions of different initial levels of exposure energy, at about 120–40%, 85–20%, 70–5%, and 50–0%, respectively, of said energy required for full exposure, on said photoresist layer.

7. A method for making color filters according to claim 1 wherein said pre-conditioning step causes four regions of different initial levels of exposure energy, at about 100–80%, 80–50%, 50–30%, and 30–0%, respectively, of said energy required for full exposure, on said photoresist layer.

8. A method for making color filters according to claim 1 wherein a same developer solution is used for all different development stages which is selected from the group consisting of the aqueous solutions of sodium carbonate, sodium hydrogen carbonate, sodium metasilicate, tetraalkyl ammonium hydroxide, sodium hydroxide, potassium hydroxide, and mixtures thereof.

9. A method for making color filters according to claim 1 wherein said light-curable colored resin comprises a cationic resin, a photoactive monomer, a photopolymerization initiator, an organic solvent, and water.

10. A method for making color filters according to claim 9 wherein said cationic resin comprises an acrylic resin containing an amino group and a neutralizing agent selected from the group consisting of formic acid, acetic acid, propionic acid, and lactic acid.

11. A method for making color filters according to claim 1 wherein said light-curable colored resin comprises an anionic resin, a photoactive monomer, a photopolymerization initiator, an organic solvent, and water.

12. A method for making color filters according to claim 11 wherein said cationic resin comprises an acrylic resin containing an acid group and a neutralizing agent selected from the group consisting of ammonia, trimethylamine, diethylamine, dimethyl ethanol amine, diethyl ethanol amine, and triethylamine.

13. A method for making color filters according to claim 1 wherein said incremental exposure energy is provided in step (e) such that only one of said regions will be developed in step (f).

14. A method for making color filters according to claim 1 wherein said substrate already contains a black-hued matrix formed thereon, and said method comprises the steps of selectively and sequentially electrodepositing red, blue, and green hued resins on said substrate.

15. A method for making color filters according to claim 1 wherein said black-hued matrix comprises a light-shielding pigment.

16. A method for making color filters according to claim 15 wherein said light-shielding pigment is carbon black.

17. A method for making color filters according to claim 1 wherein said black-hued matrix comprises a light-shielding filler material.

18. A method for making color filters according to claim 17 wherein said light-shielding filler material is titanium oxide.

19. A method for making color filters according to claim 1 wherein said substrate does not contain a black-hued matrix, and said method comprises the step of selectively and sequentially electrodepositing red, blue, green, and black hued resins on said substrate.

20. A method for making color filters according to claim 19 wherein said black hued resin is to be deposited on said region with initially least amount of exposure energy, which is designated as a $D_4$ region, and sand method further comprises the steps of:
- (a) after said red, blue, and green resins are deposited and cured, developing said $D_4$ region;
- (b) forming a black-hued photo-curable resin onto the entire photoresist layer;
- (c) shining a UV light is onto a side of said conductive glass substrate opposite of said photoresist so as to cause said black-hued photo-curable resin on said $D_4$ region to harden;
- (d) removing said black-hued photo-curable resin from other regions of said photoresist layer which remains undeveloped due to a shielding effect provided by said cured red, blue, and green resins.

* * * * *